(12) United States Patent
Kim

(10) Patent No.: US 9,263,155 B2
(45) Date of Patent: Feb. 16, 2016

(54) DATA STORING SYSTEM AND OPERATING METHOD THEREOF

(71) Applicant: SK hynix Inc., Gyeonggi-do (KR)

(72) Inventor: Eui Jin Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 208 days.

(21) Appl. No.: 14/188,268

(22) Filed: Feb. 24, 2014

(65) Prior Publication Data

US 2015/0074476 A1    Mar. 12, 2015

(30) Foreign Application Priority Data

Sep. 10, 2013  (KR) .......................... 10-2013-0108569

(51) Int. Cl.
*G11C 29/00* (2006.01)
*G11C 29/44* (2006.01)
*G11C 29/42* (2006.01)
*G06F 11/10* (2006.01)

(52) U.S. Cl.
CPC ............ *G11C 29/44* (2013.01); *G06F 11/1048* (2013.01); *G11C 29/42* (2013.01); *G11C 2029/4402* (2013.01)

(58) Field of Classification Search
CPC .................................. G11C 29/44; G11C 29/42
USPC .......................................................... 714/723
See application file for complete search history.

(56) References Cited

U.S. PATENT DOCUMENTS

| | | | | |
|---|---|---|---|---|
| 2007/0109856 A1* | 5/2007 | Pellicone | ............... | G11C 29/76 365/185.09 |
| 2011/0197101 A1* | 8/2011 | Ito | ......................... | G11C 29/883 714/723 |
| 2013/0326293 A1* | 12/2013 | Muralimanohar | ..... | G11C 29/08 714/718 |
| 2013/0346671 A1* | 12/2013 | Michael | .............. | G06F 12/0246 711/103 |

FOREIGN PATENT DOCUMENTS

KR     101095639      12/2011
KR     1020120100912   9/2012

* cited by examiner

*Primary Examiner* — David Ton
(74) *Attorney, Agent, or Firm* — IP & T Group LLP

(57) ABSTRACT

A data storing system performs a test operation on a memory block on which a read operation is determined to be failed, and determines whether the memory block is or is not a bad block based on a result of the test operation. The data storing system may improve reliability and yield of a device.

22 Claims, 6 Drawing Sheets

FIG. 1
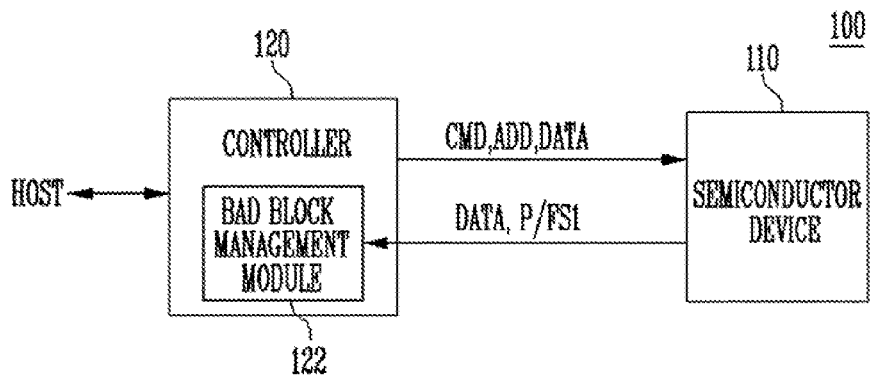
FIG. 2
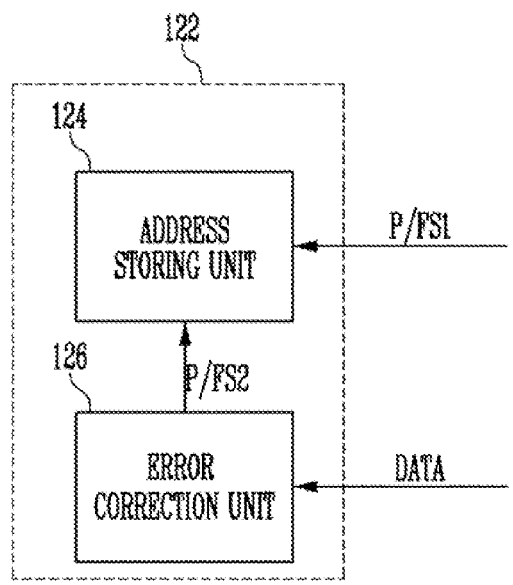
FIG. 3
| BLOCK NUMBER | MARK |
|---|---|
| BLK 1 | O |
| BLK 2 | X |
| BLK 3 | O |
| ⋮ | ⋮ |
| BLK Q | O |

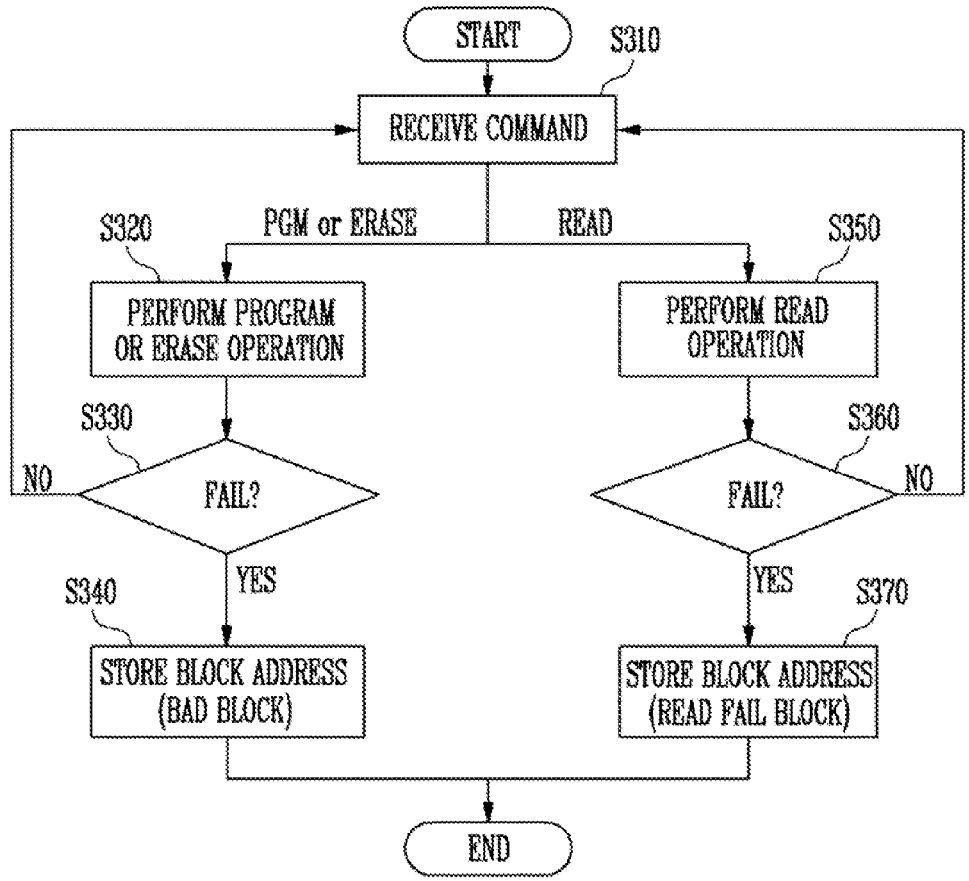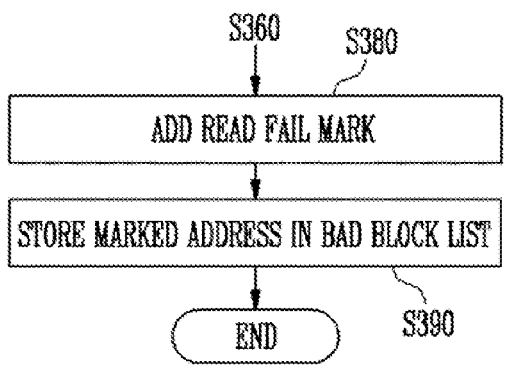

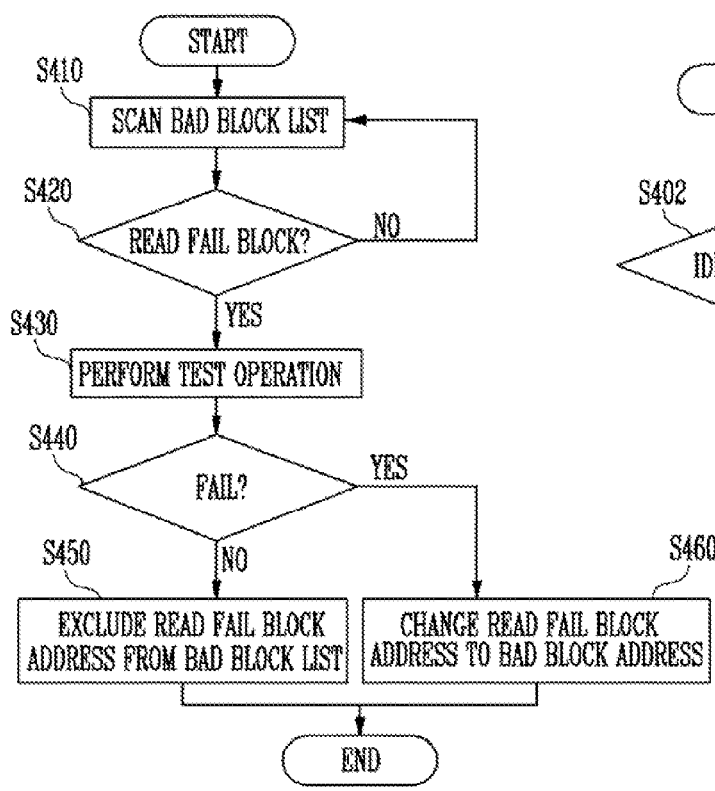
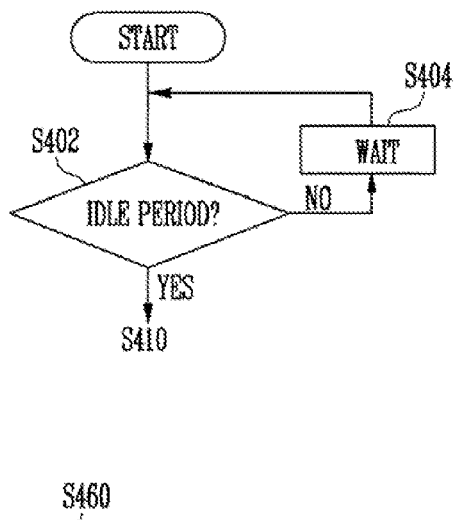
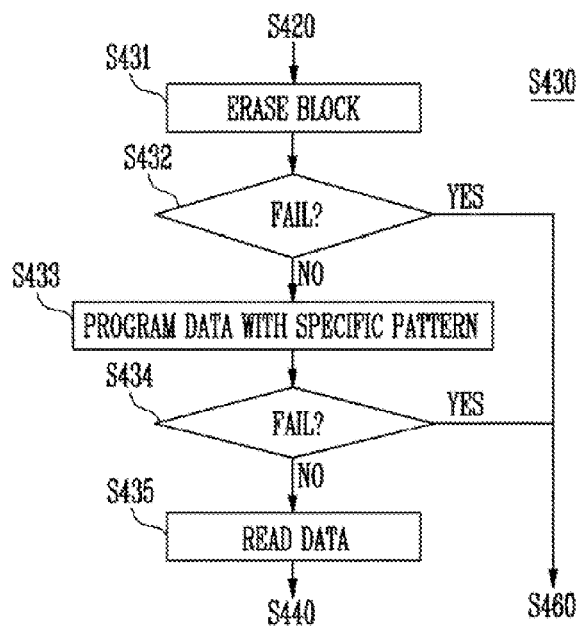

DATA STORING SYSTEM AND OPERATING METHOD THEREOF

CROSS-REFERENCE TO RELATED APPLICATION

The present application claims priority to Korean patent application number 10-2013-0108569 filed on Sep. 10, 2013, in the Korean Intellectual Property Office, the entire disclosure of which is incorporated by reference herein.

BACKGROUND

1. Technical Field

Various embodiments of the present invention relate to an electronic device, and more particularly, to a data storing system and an operating method of a data storing system.

2. Related Art

A semiconductor memory device among data storing devices may be generally classified as either a volatile memory device or a nonvolatile memory device.

The volatile memory device may perform a read/write operation at a high speed, but may lose stored data when a power supply is blocked. Meanwhile, the ion-volatile memory device has a relatively low rite and read operation speed, but may retain the stored data even when not powered. Accordingly, the non-volatile memory device is used to store data to be maintained regardless of the power supply. The non-volatile memory device includes a read only memory (ROM), a mask ROM (MROM), a programmable ROM (PROM), an electrically programmable ROM (EPROM), an electrically erasable and programmable ROM (EEPROM), a flash memory, a Phase-change random access memory (PRAM), a magnetic RAM (MRAM), a resistive RAM (RRAM), a ferroelectric RAM (FRAM), and the like. Flash memories may be divided into a NOR type and a NAND type.

The flash memory has an advantage of the RAM in which data is freely programmed and erased, and an advantage of the ROM in that stored data is maintained even when not powered. The flash memory is widely used as a storage medium of a portable electronic device, such as a digital camera, a personal digital assistant (PDA), and an MP3 player.

It is required for a semiconductor memory device, including the flash memory, to have high data reliability and yield.

BRIEF SUMMARY

Various embodiments of the present invention are directed a data storing system that may improve reliability, and an operating method of the same.

In accordance with an embodiment of the present invention, a method of operating a data storing system may include: storing a read fail block address and a bad block address in a bad block management module; performing a test operation on a read fail block corresponding to the read fail block address stored in a bad block management module; and excluding the read fail block address from the bad block management module when the test operation is determined to be passed, and determining the read fail block as the bad block when the test operation is determined to be failed.

The performing of the test operation may include: performing an erase operation on the read fail block; performing a program operation of programming data with a specific pattern on memory cells of the read fail block; and performing a read operation of reading the data from the memory cells, wherein, when the read operation is determined to be passed, the read fail block address is excluded from the bad block management module, and when the read operation is determined to be failed, the read fail block is determined as the bad block.

In accordance with another embodiment of the present invention, a data storing system may include: a controller including a bad block management module suitable for storing a read fail block address and a bad block address; and a semiconductor device suitable for performing a test operation on a read fail block among memory blocks based on a command and an address input from the controller, wherein, when the test operation is determined to be passed, the controller excludes the corresponding read fail block address from the bad block management module, and when the test operation is determined to be failed, the controller changes the corresponding read fail block address to a bad block address and stores the changed bad block address in the bad block management module.

The semiconductor device may perform a read operation on memory cells of a memory block in response to a command and an address input from the controller, and when the read operation is determined to be failed, the controller may store an address of the memory block as the read fail block address in the bad block management module.

In accordance with another embodiment of the present invention, a data storing system may include: a controller suitable for storing a bad block list; and a semiconductor device suitable for performing a test operation on a memory block corresponding to a block address listed on the bad block list as a provisional read fail block, wherein the controller updates the bad block list on the provisional read fail block depending on the result of the test operation.

The data storing system and the operating method of the data storing system perform a test operation on a memory block of which a read operation is failed, and determine that the memory block is or is not a bad block based on a result of the test operation, thereby improving reliability and yield of a device.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which:

FIG. 1 is a block diagram illustrating a data storing system according to an exemplary embodiment of the present invention;

FIG. 2 is a detailed diagram illustrating a bad block management module illustrated in FIG. 1;

FIG. 3 is a diagram illustrating a bad block list of an address storing unit illustrated in FIG. 2;

FIG. 5 is a flowchart for describing a method of storing a bad block address according to an exemplary embodiment of the present invention;

FIG. 6 is a detailed flowchart for describing a step of storing a bad block address illustrated in FIG. 5;

FIG. 7 is a flowchart for describing a method of updating a bad block address according to the exemplary embodiment of the present invention;

FIG. 8 is a flowchart for describing an additional steps for the method of updating the bad block address illustrated in FIG. 7;

FIG. 9 is a detailed flowchart for describing a step of performing a test operation illustrated in FIG. 7;

DETAILED DESCRIPTION

Figure 4:
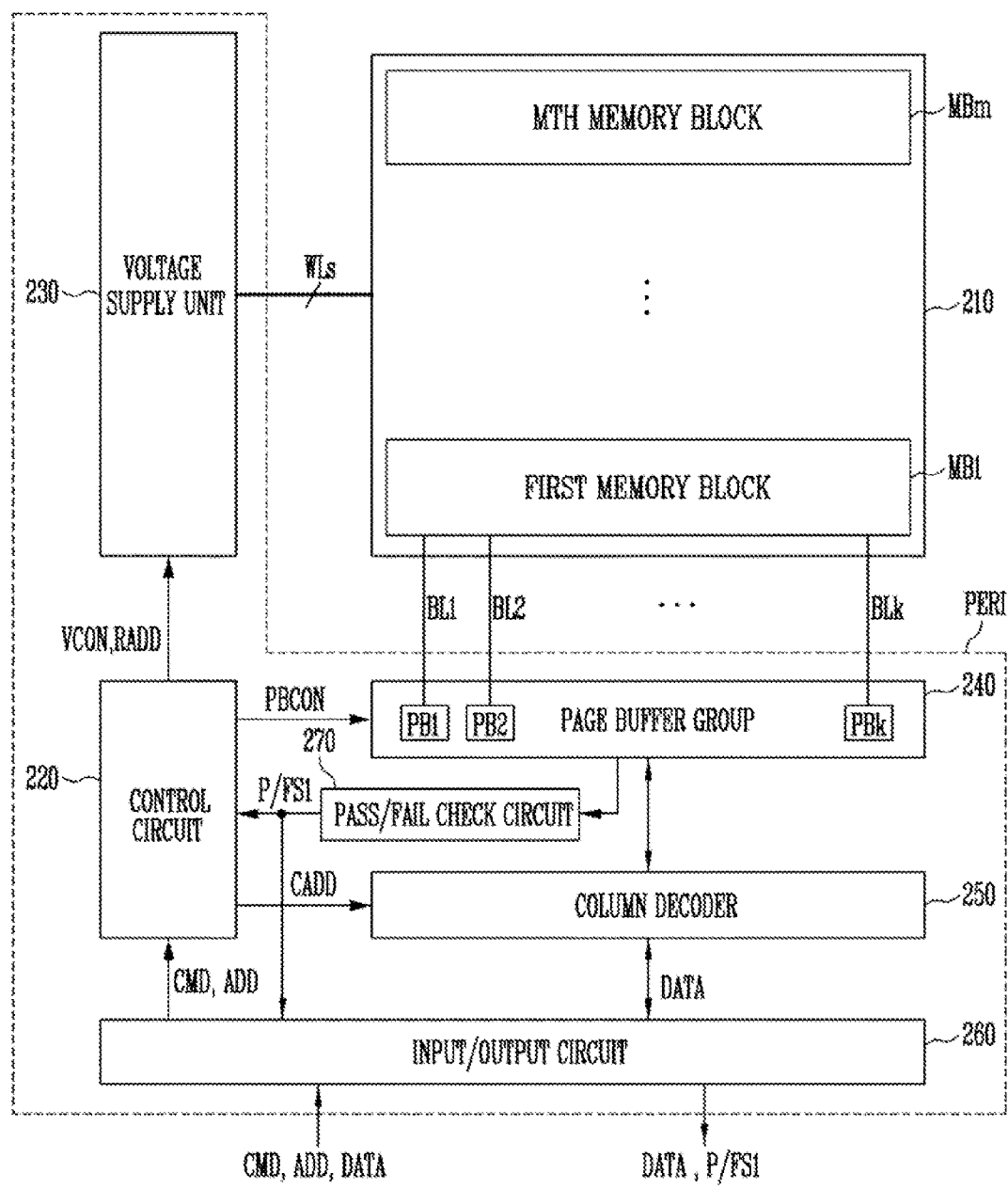
FIG. 4 is a block diagram illustrating a semiconductor device illustrated in FIG. 1.

Hereinafter, an embodiment of the present invention will be described with reference to the accompanying drawings in detail. However, the present invention is not limited to an embodiment disclosed below and may be implemented in various forms and the scope of the present invention is not limited to the following embodiments. Rather, the embodiment is provided to more sincerely and fully disclose the present invention and to completely transfer the spirit of the present invention to those skilled in the art to which the present invention pertains and the scope of the present invention should be understood by the claims of the present invention. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a block diagram illustrating a data storing system according to an embodiment of the present invention.

Referring to FIG. 1, a data storing system 100 may include a semiconductor device 110, and a controller 120 for controlling an operation of the semiconductor device 110 in response to a request of a host.

The semiconductor device 110 performs a program operation and a read operation, or an erase operation in response to a command CMD and an address ADD input from the controller 120. The semiconductor device 110 performs a test operation on a read fail block among memory blocks in response to the command CMD and the address ADD input from the controller 120.

The controller 120 may include a bad block management module 122 storing a read fail block address and a bad block address. When the program operation or the erase operation on the memory block is determined to be failed, the controller 120 stores an address corresponding to the memory block in the bad block management module 122 as a bad block address. When the read operation on the memory block is determined to be failed, the controller 120 stores an address corresponding to the memory block in the bad block management module 122 as a read fail block address. When the test operation on the memory block is determined to be passed, the controller 120 deletes (or excludes) the read fail block address from the bad block management module 122, and when the test operation is determined to be failed, the controller 120 changes the read fail block address to a bad block address, and stores the bad block address in the bad block management module 122.

The semiconductor device 110 performs the erase operation on the read fail block in response to an erase command during the test operation. The controller 120 changes the read fail block address to a bad block address when a pass/fail signal P/FS1 denotes that the erase operation is determined to be failed, and stores the bad block address in the bad block management module 122.

When the erase operation is determined to be passed, the semiconductor device 110 performs a program operation of programming data with a predetermined pattern in memory cells of the erased read fail block in response to a program command. The controller 120 changes the read fail block address to a bad block address when the pass/fail signal P/FS1 denotes that the program operation is determined to be failed, and stores the bad block address in the bad block management module 122.

When the program operation is determined to be passed, the semiconductor device 110 performs the read operation of reading data from the memory cells in response to a read command. Based on the read data, when the read operation is determined to be passed, the controller 120 deletes (or excludes) the read fail block address from the bad block management module 122, and when the read operation is determined to be failed, the controller 120 changes the read fail block address to a bad block address, and stores the bad block address in the bad block management module 122.

As an exemplary embodiment, the controller 120 may output the command CMD and the address ADD to the semiconductor device 110 to perform the test operation during an idle period of the data storing system 100. Accordingly, it may be possible to prevent the data storing system 100 from performance deterioration due to additional performance of the test operation.

As an exemplary embodiment, the controller 120 may output the command CMD and the address ADD to the semiconductor device 110 to perform the test operation when a free (or available) address storage space within the bad block management module 122 becomes equal to or lower than a threshold. Accordingly, it may be possible to prevent the performance of the test operation from being stopped due to a small free space of the address storing space of the bad block management module 122, and continuously perform the test operation.

As an exemplary embodiment, the semiconductor device 110 stores the read fail block address and the bad block address stored in the bad block management module 122. The controller 120 outputs the command CMD and the address ADD so that the read fail block address and the bad block address stored in the semiconductor device 110 are stored in the bad block management module 122 when power is on. Accordingly, even though the power is off the read fail block address and the bad block address may be stably maintained. Further, the bad block management module 122 may not need to include a non-volatile storing means, and includes a volatile storing means, thereby improving an operation speed.

FIG. 2 is a block diagram for describing the bad block management module illustrated in FIG. 1.

Referring to FIG. 2, the bad block management module 122 may include an address storing unit 124 and an error correction unit 126.

The error correction unit 126 detects and corrects an error of data DATA read from the semiconductor device, and generates the pass/fail signal P/FS2 for the read operation depending on the error detection.

The address storing unit 124 stores and changes the read fail block address corresponding to the memory block of which the read operation is determined to be failed, and the bad block address corresponding to the memory block of which the program operation or the erase operation is determined to be failed. The address storing unit 124 may include a bad block list (or a bad block table) for storing and changing the read fail block address and the bad block address.

During the test operation, the address storing unit 124 changes the read fail block address to the bad block address when the pass/fail signal P/FS1 denotes that the program operation or the erase operation is determined to be failed, and stores the changed bad block address in the bad block list. During the test operation, the address storing unit 124 excludes the read fail block address from the bad block list when the pass/fail signal P/FS2 denotes that the read operation is determined to be passed, and changes the read fail block address to the bad block address when the pass/fail signal P/FS2 denotes that the read operation is determined to be failed, and stores the changed bad block address in the bad block list. For reference, the address storing unit 124 may include a volatile memory such as an SRAM.

Accordingly, when the memory block on which the read operation is determined to be failed the test operation is performed, and the memory block is determined as the bad block or is not determined as the bad block based on a result of the test operation, so that reliability and yield of the device may be improved.

FIG. 3 is a diagram for describing the bad block list included in the address storing unit 124 illustrated in FIG. 2.

Referring to FIG. 3, the bad block list may include block numbers (or block addresses) and marks. Bad block addresses and read fail block addresses are stored (or written) in the bad block list. When the program operation or the erase operation on the memory block is determined to be failed, an address corresponding to the memory block (i.e., the bad block address) is stored in the bad block list, and marked as "X". When the read operation on the memory block is determined to be failed, an address corresponding to the memory block (i.e., the read fail block address) is stored in the bad block list, and marked as "O". That is, in the bad block list, the bad block address and the read fail block address are divided by the marks.

For example, memory blocks 1, 3, and Q are stored in the bad block list as the read fail block, and memory block 2 is stored as the bad block in the bad block list. It is determined whether the provisional read fail block is the bad block or a good block by performing the aforementioned test operation.

FIG. 4 is a block diagram illustrating the semiconductor device illustrated in FIG. 1.

Referring to FIG. 4, the semiconductor device may include a memory array 210 including a first to $m^{th}$ blocks MB1 to MBm, and a peripheral circuit PERI performing a program operation, a read operation, and an erase operation on memory cells included in a selected page of the memory blocks MB1 to MBm. The peripheral circuit PERI may include a control circuit 220, a voltage supply circuit 230, a page buffer group 240, a column circuit 250, an input/output circuit 260, and a pass/fail check circuit 270.

The memory cells included in the memory block may be divided in the unit of a physical page or a logical page. The page serves as a basic unit of the program operation or the read operation.

The control circuit 220 outputs a voltage control signal VCON for generating a necessary voltage to perform the program operation, the read operation or the erase operation in response to a command CMD input through the input/output circuit 260 from the outside, and outputs a PB control signal PBCON for controlling page buffers PB1 to PBk included in the page buffer group 240 according to the type of operation. Further, the control circuit 220 outputs a row address signal RADD and a column address signal CADD in response to an address signal ADD input from the outside through the input/output circuit 260.

The voltage supply circuit 230 supplies operating voltages necessary for the program operation, the read operation, and the erase operation on the memory cells to local lines in response to the voltage control signal VCON of the control circuit 220. The voltage supply unit 230 may include a voltage generating circuit and a row decoder.

The voltage generating circuit outputs operating voltages necessary for the program operation, the read operation, and the erase operation on the memory cells to global lines in response to the voltage control signal VCON of the control circuit 220.

The row decoder connects the global lines and the local lines so that the operating voltages output from the voltage generating circuit to the global lines is transmittable to the local lines of the memory block selected in the memory array 210 in response to the row address signals RADD of the control circuit 220.

The page buffer group 240 includes the page buffers PB1 to PBk connected with the memory array 210 through bit lines BL1 to BLk. The page buffers PB1 to PBk of the page buffer group 240 selectively precharges the bit lines BL1 to BLk depending on input data to store data in the memory cells, or senses voltages of the bit lines BL1 to BLk to read data from the memory cells in response to the PB control signal PBCON of the control circuit 220.

The column circuit 250 selects the page buffers PB1 to PBk included in the page buffer group 140 in response to the column address signal CADD output from the control circuit 220. That is the column circuit 250 sequentially transmits the data to be stored in the memory cells to the page buffers PB1 to PBk in response to the column address signal CADD. Further, the column circuit 250 sequentially selects the page buffers PB1 to PBk in response to the column address signal CADD so that the data of the memory cells latched in the page buffers PB1 to PBk by the read operation is output to the outside.

In order to store data in the memory cells during the program operation, the input/output circuit 260 transmits the data to the column circuit 250 under the control of the control circuit 220 to input the data input from the outside to the page buffer group 240. When the column circuit 250 transmits the data transmitted from the input/output circuit 260 to the page buffers PB1 to PBk of the page buffer group 240, the page buffers PB1 to PBk store the input data in internal latch circuits. Further, the input/output circuit 260 outputs the data transmitted through the column circuit 250 from the page buffers PB1 to PBk of the page buffer group 240 to the outside.

The pass/fail check circuit 270 outputs the pass/fail signal P/FS1 in response to comparison result signals output from the page buffers PB1 to PBk, respectively, in a program verification operation performed after the program operation or an erase verification operation performed after the erase operation. Particularly, a threshold voltage of the memory cell is compared with a target voltage in the program verification operation or the erase verification operation, and a result value of the comparison is latched in the internal latch circuits of the page buffers PB1 to PBk. Further, the latched comparison result signals are output to the pass/fail check circuit 270. The pass/fail check circuit 270 outputs the pass/fail signal P/FS1 representing whether the program operation or the erase operation is completed to the control circuit 220 in response to the comparison result signals. The pass/fail signal P/FS1 is output to a controller through the input/output circuit 260.

FIG. 5 is a flowchart for describing a method of storing a bad block address according to the exemplary embodiment of the present invention.

Referring to FIGS. 1, 2, 3, and 5, in the method of storing a bad block address, a command is first received from the controller (S310).

When the received command is a program command or an erase command, a program operation or an erase operation is performed on a memory block (S320).

Next, a program verification operation or an erase verification operation is performed (S330).

When the program operation or the erase operation is determined to be failed as a result of the performance of the program verification operation or the erase verification operation, an address corresponding to the memory block is stored in the address storing unit 124 of the bad block management module 122 as a bad block address (S340).

Meanwhile, when the received command is a read command, a read operation is performed on the memory block (S350).

The error correction unit of the controller performs an error correction operation based on the read data (S360). When the read operation is determined to be failed, for example, when the number of error bits of the data is larger than the number of error correctable bits, the address corresponding to the memory block is stored as a read fail block address in the address storing unit 124 of the bad block management module 122 (S370).

When the program operation, the erase operation, or the read operation is determined to be passed, the process returns to the step S310.

FIG. 6 is a detailed flowchart for describing a step S370 illustrated in FIG. 5.

Referring to FIGS. 3 and 6, the had block address and the read fail block address may be stored in the bad block list.

When an address corresponding to a memory block on which a read operation is determined to be failed, contrary to the had block address, a read fail mark may be added to the read fail block address (S380). That is, the fail block address may be assumed as a provisional bad block address.

Next, the corresponding block address is stored in the bad block list as the fail block address (S390).

FIG. 7 is a flowchart for describing a method of updating the bad block address according to the embodiment of the present invention.

Referring to FIG. 7, the bad block list is first scanned (S410).

Whether the memory block is a read fail block is checked (S420), and a test operation is performed on the read fail block (S430). When the memory block is checked and determined that it is not a read fail block, the bad block list is continuously scanned.

A result of the performance of the test operation is checked (S440), and when the test operation is determined to be passed, the read fail block address is deleted (or excluded) in the bad block list (S450). When the test operation is determined to be failed, the read fail block address is changed (or determined) to the bad block address (S460).

Accordingly, when the memory block on which the read operation is determined to be failed, the test operation is performed, and the memory block is determined as the bad block or as a good block based on a result of the test operation, so that reliability and yield of the device may be improved.

FIG. 8 is a flowchart for describing additional steps for the method of updating the bad block address illustrated in FIG. 7.

Referring to FIG. 8, before scanning the bad block list (S410), whether the data storing system is currently operated in an idle period may be first checked (S402).

When the data storing system is operated in the idle period, the bad block list is scanned (S410). When the data storing system is currently not operated in the idle period, the scanning of the bad block list is waited, for example, for a predetermined interval (S404). Accordingly, it may be possible to prevent the data storing system from performance deterioration by additionally performing the test operation. Accordingly, it may be possible to prevent the data storing system 100 from performance deterioration due to additional performance of the test operation.

FIG. 9 is a detailed flowchart for describing the step S430 illustrated in FIG. 7.

Referring to FIG. 9, when the memory block is checked as a read fail block at the step S420, an erase operation is performed on the memory block (i.e., the read fail block), on which the test operation is to be performed, when performing the test operation (S431).

A result of the erase operation is checked (S432), and when the erase operation is determined to be passed, a program operation of programming data with a predetermined pattern in memory cells of the read fail block is performed (S433). When the erase operation is determined to be failed, the read fail block is determined as the bad block (S460).

Next, a result of the program operation is checked (S434) and when the program operation is determined to be passed, a read operation of reading the data with the specific pattern from the memory cells is performed (S435). When the program operation is determined to be failed, the read fail block is determined as the bad block (S460).

Then, a result of the read operation may be checked (S440). When the read operation is determined to be passed, the read fail block is not determined as the bad block, that is, the read fail block is determined as a good block (S450). When the read operation is determined to be failed, the read fail block is determined as the bad block (S460).

Figure 10:
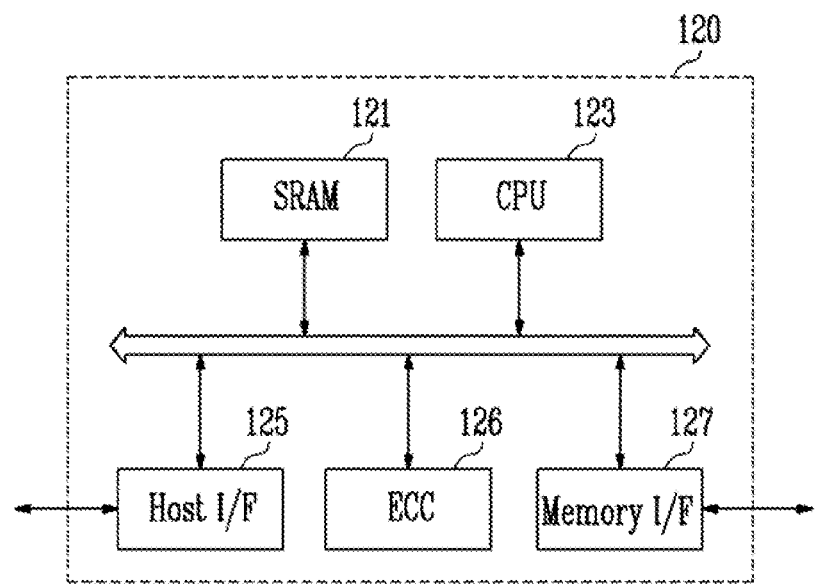
FIG. 10 is a block diagram for describing a detailed configuration of a controller illustrated in FIG. 1.

FIG. 10 is a block diagram for describing a detailed configuration of a controller illustrated in FIG. 1.

The data storing system 100 illustrated in FIG. 1 may be provided as a memory card or a solid-state disk (SSD) by a combination of the semiconductor device 110 and the controller 120.

Referring to FIG. 10, the controller 120 may include an SRAM 121, a central processing unit (CPU) 123, a host interface (I/F) 125, the error correction unit (ECC) 126 shown in FIG. 2, and a memory I/F 127. The SRAM 121 is used as an operating memory of the CPU 123. For example, the SRAM 121 may be used as the address storing unit 124 shown in FIG. 2. The host interface 125 includes a data exchange protocol of a host connected with the data storing system 100. The error correction unit 126 detects and corrects an error included in data read from the semiconductor device 110 shown in FIG. 1. The memory I/F 127 interfaces with the semiconductor device 110. The CPU 123 performs a general control operation for the data exchange of the controller 120.

Although not illustrated in the drawing, the data storing system 100 may further include a ROM storing code data for interfacing with the host. In addition, the semiconductor device 110 may be provided in a form of a mufti-chip package including a plurality of flash memory chips. The data storing system 100 may be provided as a storage medium having a low error rate and high reliability. Especially, the semiconductor device may be included in a memory system, such as an SSD. In such case, the controller 120 may communicate with an external device, for example, the host, through one of various interface protocols, such as a universal serial bus (USB), a multi-media card (MMC), a peripheral component interconnect (PCI), a peripheral component interconnect-express (PCI-E), a serial advanced technology attachment (SATAN, parallel advanced technology attachment (PATH), a small computer system interface (SCSI), an enhanced small device interface (ESDI), and an integrated drive electronics (IDE).

Figure 11:
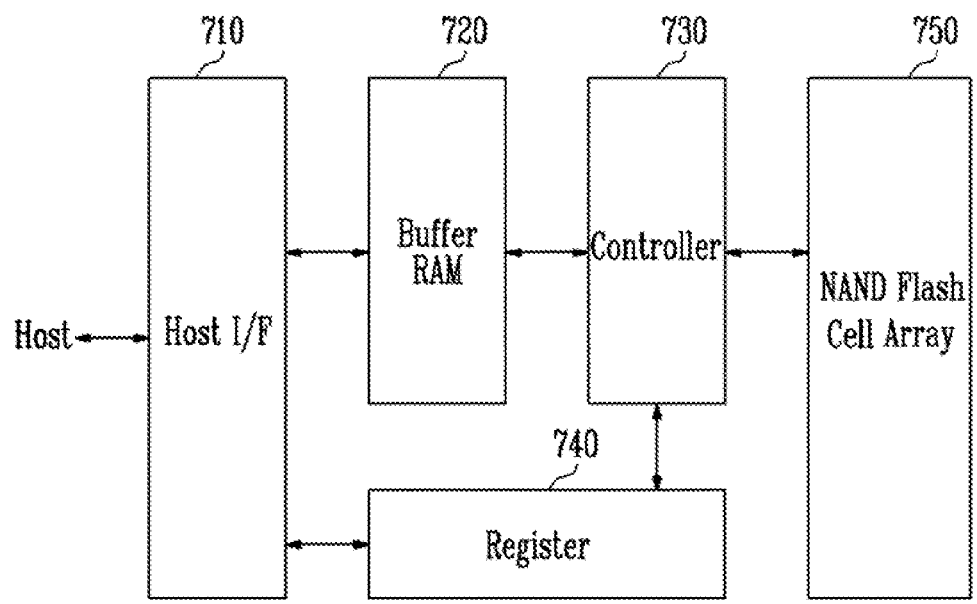
FIG. 11 is a block diagram illustrating a fusion memory device or a fusion memory system performing operations according to an embodiment of the present invention.

FIG. 11 is a block diagram illustrating a fusion memory device or a fusion memory system performing operations according to aforementioned various embodiments. For example, the technical features of the embodiment of the present invention may be applied a OneNAND flash memory semiconductor device 700 as a fusion memory device.

The OneNAND flash memory device 700 may include a host interface (I/F) 710 for exchanging various information with a device using different protocols, a buffer RAM 720 including a code for driving the OneNAND flash memory device 700, or temporarily storing data, a controller 730 controlling a read operation, a program operation, and all states based on a control signal and a command provided from the outside, a register 740 storing a command, an address, and data, such as configuration, defining a system operating environment within the OneNAND flash memory device 700, and a NAND flash cell array 750 formed of the operating circuit including a plurality of non-volatile memory cells and a plurality of page buffers. The OneNAND flash memory device 700 operates in response to a write request from the host by the aforementioned method.

Figure 12:
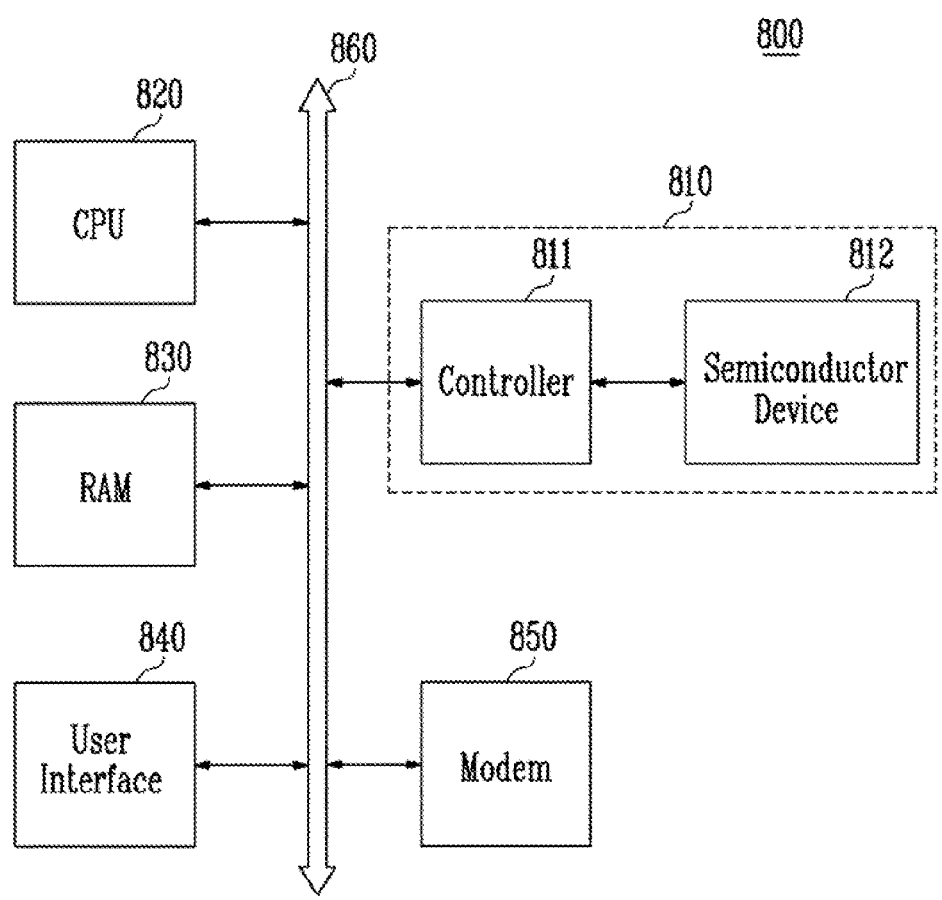
FIG. 12 is a block diagram illustrating a computing system including a semiconductor device according to an exemplary embodiment of the present invention.

FIG. 12 schematically illustrates a computing system 800 including a semiconductor device 812 according to an embodiment of the present invention.

The computing system 800 may include a microprocessor (e.g., CPU) 820, a RAM 830, a user interface 840, a modem 850 such as a baseband chipset, and a data storing system 810, which are electrically connected to a system bus 860. The data storing system 810 may include a controller (memory controller) 811 and semiconductor device 812. In a case where the computing system 800 is a mobile device, a battery (not shown) for supplying an operating voltage of the computing system 800 may be further provided. Although not illustrated in the drawing, the computing system 800 may further include an application chipset, a camera image processor (CIP), a mobile DRAM, and the like. Meanwhile, the data storing system 810 may be configured by, for example, an SSD using a non-volatile memory for storing data. Otherwise, the data storing system 810 may be provided as a fusion flash memory, for example, a OneNAND flash memory.

The above-mentioned exemplary embodiments of the present invention are not embodied only by an apparatus and method. Alternatively, the above-mentioned exemplary embodiments may be embodied by a program performing functions, which correspond to the configuration of the exemplary embodiments of the present invention, or a recording medium on which the program is recorded. These embodiments can be easily devised from the description of the above-mentioned exemplary embodiments by those skilled in the art to which the present invention pertains.

As described above, the embodiment has been disclosed in the drawings and the specification. The specific terms used herein are for purposes of illustration, and do not limit the scope of the present invention defined in the claims. Accordingly, those skilled in the art will appreciate that various modifications and another equivalent example may be made without departing from the scope and spirit of the present disclosure. Therefore, the sole technical protection scope of the present invention will be defined by the technical spirit of the accompanying claims.

What is claimed is:

1. A method of operating a data storing system, comprising:
storing a read fail block address and a bad block address in a bad block management module;
performing a test operation on a read fail block corresponding to the read fail block address stored in the bad block management module; and
excluding the read fail block address from the bad block management module when the test operation is determined to be passed, and determining the read fail block as the bad block when the test operation is determined to be failed.

2. The method of claim 1, wherein the storing of the read fail block address comprising:
performing a read operation on memory cells of a memory block; and
storing an address corresponding to the memory block as the read fail block address in the bad block management module when the read operation is determined to be failed.

3. The method of claim 1, wherein the test operation is performed during an idle period of the data storing system.

4. The method of claim 1, wherein the test operation is performed when a free address storage space within the bad block management module becomes equal to or lower than a threshold.

5. The method of claim 1, wherein the performing of the test operation includes:
performing an erase operation on the read fail block;
performing a program operation of programming data pith specific pattern on memory cells of the read fail block; and
performing a read operation of reading the data from the memory cells,
wherein, when the read operation is determined to be passed, the read fail block address is excluded from the bad block management module, and when the read operation is determined to be failed, the read fail block is determined as the bad block.

6. The method of claim 5, wherein when the erase operation is determined to be passed, the program operation is performed, and when the erase operation is determined to be failed, the program operation is not performed, and the read fail block is determined as a bad block.

7. The method of claim 5, wherein when the program operation is determined to be passed, the read operation is performed, and when the program operation is determined to be failed, the read operation is not performed, and the read fail block is determined as a bad block.

8. The method of claim 5, wherein, when the number of error bits within the read data is larger than the number of error correctable bits, the read operation is determined to be failed.

9. The method of claim 1, further comprising:
performing a program operation or an erase operation on memory cells of a memory block; and
storing an address corresponding to the memory block as the bad block address in the bad block management module when the program operation or the erase operation is determined to be failed.

10. A data storing system, comprising:
a controller including a bad block management module suitable for storing a read fail block address and a bad block address; and
a semiconductor device suitable for performing a test operation on a read fail block among memory blocks based on a command and an address input from the controller,
wherein, when the test operation is determined to be passed, the controller excludes the corresponding read fail block address from the bad block management module, and when the test operation is determined to be failed, the controller changes the corresponding read fail block address to a bad block address and stores the changed bad block address in the bad block management module.

11. The data storing system of claim 10, wherein the semiconductor device performs a read operation on memory cells of a memory block, and
when the read operation is determined to be failed, the controller stores an address corresponding to the memory block as the read fail block address in the bad block management module.

12. The data storing system of claim 11, wherein the semiconductor device stores the read fail block address and the bad block address, and
the controller stores the read fail block address and the bad block address in the bad block management module when power is on.

13. The data storing system of claim 10, wherein the test operation is performed during an idle period of the data storing system.

14. The data storing system of claim 10, wherein the test operation is performed when a free address storage space within the bad block management module becomes equal to or lower than a threshold.

15. The data storing system of claim 10, wherein the semiconductor device performs an erase operation on the read fail block in response to a first command during the test operation, and
when the erase operation during the test operation is determined to be failed, the controller changes the corresponding read fail block address to the bad block address and stores the changed bad block address in the bad block management module.

16. The data storing system of claim 15, wherein when the erase operation is determined to be passed, the semiconductor device performs a program operation of programming data with a specific pattern in memory cells of the erased read fail block in response to a second command during the test operation, and
when the program operation is determined to be failed, the controller changes the corresponding read fail block address to the bad block address and stores the changed bad block address in the bad block management module.

17. The data storing system of claim 16, wherein, when the program operation is determined to be passed, the semiconductor device performs a read operation of reading the data from the memory cells of the programmed read fail block in response to a third command during the test operation,
when the read operation is determined to be passed, the controller excludes the corresponding read fail block address from the bad block management module, and
when the read operation is determined to be failed, the controller changes the corresponding read fail block address to the bad block address and stores the changed bad block address in the bad block management module.

18. The data storing system of claim 10, wherein the bad block management module includes:
an address storing unit suitable for storing the read fail block address and the bad block address; and
an error correction unit suitable for detecting and correcting an error of data read from the semiconductor device, and generate a pass/fail signal of the read operation depending on the error detection.

19. A data storing system, comprising:
a controller suitable for storing a bad block list; and
a semiconductor device suitable for performing a test operation on a memory block corresponding to a block address listed on the bad block list as a provisional read fail block,
wherein the controller updates the bad block list on the provisional read fail block depending on the result of the test operation.

20. The data storing system of claim 19, wherein, depending on the result of the test operation, the provisional read fail block is excluded from the bad block list or is arranged as a bad block.

21. The data storing system of claim 19, wherein the test operation includes an erase operation, a program operation, and a read operation sequentially performed on the memory block.

22. The data storing system of claim 19, wherein the test operation is performed during an idle period of the data storing system.

* * * * *